United States Patent
Bainvoll et al.

[11] Patent Number: 5,808,512
[45] Date of Patent: Sep. 15, 1998

[54] FEED FORWARD AMPLIFIERS AND METHODS

[75] Inventors: Efraim Bainvoll, Los Angeles; Yonatan Biran, Agoura, both of Calif.

[73] Assignee: Ophir RF, Inc., Los Angeles, Calif.

[21] Appl. No.: 792,098

[22] Filed: Jan. 31, 1997

[51] Int. Cl.⁶ .................................................. H03F 1/32
[52] U.S. Cl. ........................ 330/151; 375/297; 455/63; 455/126
[58] Field of Search .......................... 330/151; 332/123, 332/159, 160, 161, 162; 375/297; 455/63, 126

[56] References Cited

U.S. PATENT DOCUMENTS

| | | |
|---|---|---|
| 3,471,798 | 10/1969 | Seidel . |
| 3,541,467 | 11/1970 | Seidel . |
| 3,649,927 | 3/1972 | Seidel . |
| 3,815,040 | 6/1974 | Seidel . |
| 4,379,994 | 4/1983 | Bauman . |
| 4,389,618 | 6/1983 | Bauman . |
| 4,394,624 | 7/1983 | Bauman . |
| 4,560,945 | 12/1985 | Olver .................................... 330/149 |
| 4,583,049 | 4/1986 | Powell . |
| 5,077,532 | 12/1991 | Obermann et al. . |
| 5,130,663 | 7/1992 | Tattersall, Jr. . |
| 5,155,448 | 10/1992 | Powell . |
| 5,177,197 | 1/1993 | Hsu et al. . |
| 5,307,022 | 4/1994 | Tattersall, Jr. et al. . |
| 5,323,119 | 6/1994 | Powell et al. . |
| 5,491,454 | 2/1996 | Matz . |
| 5,528,196 | 6/1996 | Baskin et al. . |
| 5,532,642 | 7/1996 | Takai . |

OTHER PUBLICATIONS

"Circuit and Component Details of the Broadband Linear Amplifier", P.B. Kenington, Centre for Communications Research, University of Bristol (Sep. 1990).

"Broadband Linear Power Amplifier", BTG.

*Primary Examiner*—James B. Mullins
*Attorney, Agent, or Firm*—Blakely, Sokoloff, Taylor & Zafman LLP

[57] ABSTRACT

Feed forward amplifiers and methods particularly suited for power multichannel microwave amplifiers for cellular phone base stations and the like. The input signal is modulated with a small percentage of modulation at a relatively low frequency before being amplified by the main amplifier. At the same time, the input signal is also coupled to provide inphase and quadrature components thereof to be mixed with the amplifier output and lowpass filtered to extract a component of the low frequency responsive to modulation components in the amplifier output due to the low frequency modulation. This signal is then multiplied by the low frequency to provide a DC voltage controlling an adaptive control circuit to adjust the inphase and quadrature components of the intermodulation components and the low frequency modulation of the entire signal so that the result can be combined with the main amplified signal to remove the intermodulation components and the low frequency modulation of the entire signal from the amplifier output.

20 Claims, 2 Drawing Sheets

FEED FORWARD AMPLIFIERS AND METHODS

BACKGROUND OF THE INVENTION

1. Field of the Invention

The present invention relates to the field of feed forward amplifiers.

2. Prior Art

In the case of multichannel amplifiers such as power multichannel microwave amplifiers for such purposes as cellular phone base stations and the like, the signal to be amplified is comprised of a substantial number of carrier frequencies spread across the bandwidth of the amplifier and spaced apart from each other by some predetermined carrier separation. In use, and from time to time, any number of these carrier frequencies may be modulated by a relatively low frequency signal, such as a voice signal, to create sidebands around the respective carrier frequency, with the sidebands being limited in width to maintain a minimum separation between the sidebands of one carrier frequency and the sidebands of the adjacent carrier frequencies.

In use, the power amplifier is simply desired to amplify each of the modulated carriers to the desired power level. However, in practice the nonlinearity of a power microwave amplifier will cause intermodulation components which will create cross-talk between channels. In a voice system, this cross-talk can create one or more background conversations in any channel. In a data transmission system, the intermodulation will cause noise on each channel which could be interpreted as a signal on any particular channel during quiet times of that channel, and which reduces the signal to noise ratio of a channel when that channel is active.

The intermodulation problem is not because power microwave amplifiers are inherently badly nonlinear, but rather because of (i) the bandwidth requirements of such amplifiers, and (ii) the fact that rather than amplifying a single signal, the amplifier is required to amplify a relatively large plurality of individual signals spread across the bandwidth. Because of these factors, the linearity requirements for power microwave amplifiers in general substantially exceeds the achievable linearity of the amplifiers.

To overcome the effects of the amplifier nonlinearity, it is common to provide a feed forward capability for such amplifiers. In a feed forward amplifier, intermodulation components which are generated by the amplifier are evaluated and then added to the amplifier output in appropriate amplitude and 180° out of phase to remove the same from the output. Thus, the nonlinearity of the amplifier still exists, but the effects of that nonlinearity within the desired bandpass of the amplifier are removed, as if the amplifier in fact had a much greater linearity than it really does.

In one prior art feed forward power microwave amplifier, a pilot frequency is merely added to the input of the main amplifier and the resulting intermodulation components thereof used to determine the feed forward to clean up the output. One such prior art system used a pilot frequency just out of the bandpass of the amplifier. This has the disadvantage of limiting the useful bandwidth of the amplifier to approximately half of its potential bandwidth, as the amplifier performance over a band on the other side of the pilot frequency would generally be approximately as good. However, the use of a pilot frequency in the bandpass of the amplifier would create objectionable interference. Another prior art system got around this problem by using a pilot frequency within the bandpass of the amplifier, but cycling the pilot frequency within the bandpass of the amplifier at a sufficient rate so as to not create significant interference. This has some advantages with respect to bandwidth, though control has its problems when the pilot frequency passes through each carrier frequency.

The present invention overcomes the foregoing problems by using a feed forward technique which determines the amount of intermodulation within the bandpass of the amplifier, and removes the same from the amplifier output utilizing relatively simple circuit elements for the purpose.

SUMMARY OF THE INVENTION

Feed forward amplifiers and methods particularly suited for power multichannel microwave amplifiers for cellular phone base stations and the like. The input signal is modulated with a small percentage of modulation at a relatively low frequency before being amplified by the main amplifier. At the same time, the input signal is also coupled to provide inphase and quadrature components thereof to be mixed with the amplifier output and lowpass filtered to extract a component of the low frequency responsive to modulation components in the amplifier output due to the low frequency modulation. This signal is then multiplied by the low frequency to provide a DC voltage controlling an adaptive control circuit to adjust the inphase and quadrature components of the intermodulation components and the low frequency modulation of the entire signal so that the result can be combined with the main amplified signal to remove the intermodulation components and the low frequency modulation of the entire signal from the amplifier output.

The net effect of the invention is the elimination of some of the more complicated and costly components used in the prior art.

DETAILED DESCRIPTION OF THE PRESENT INVENTION

Figure 1:
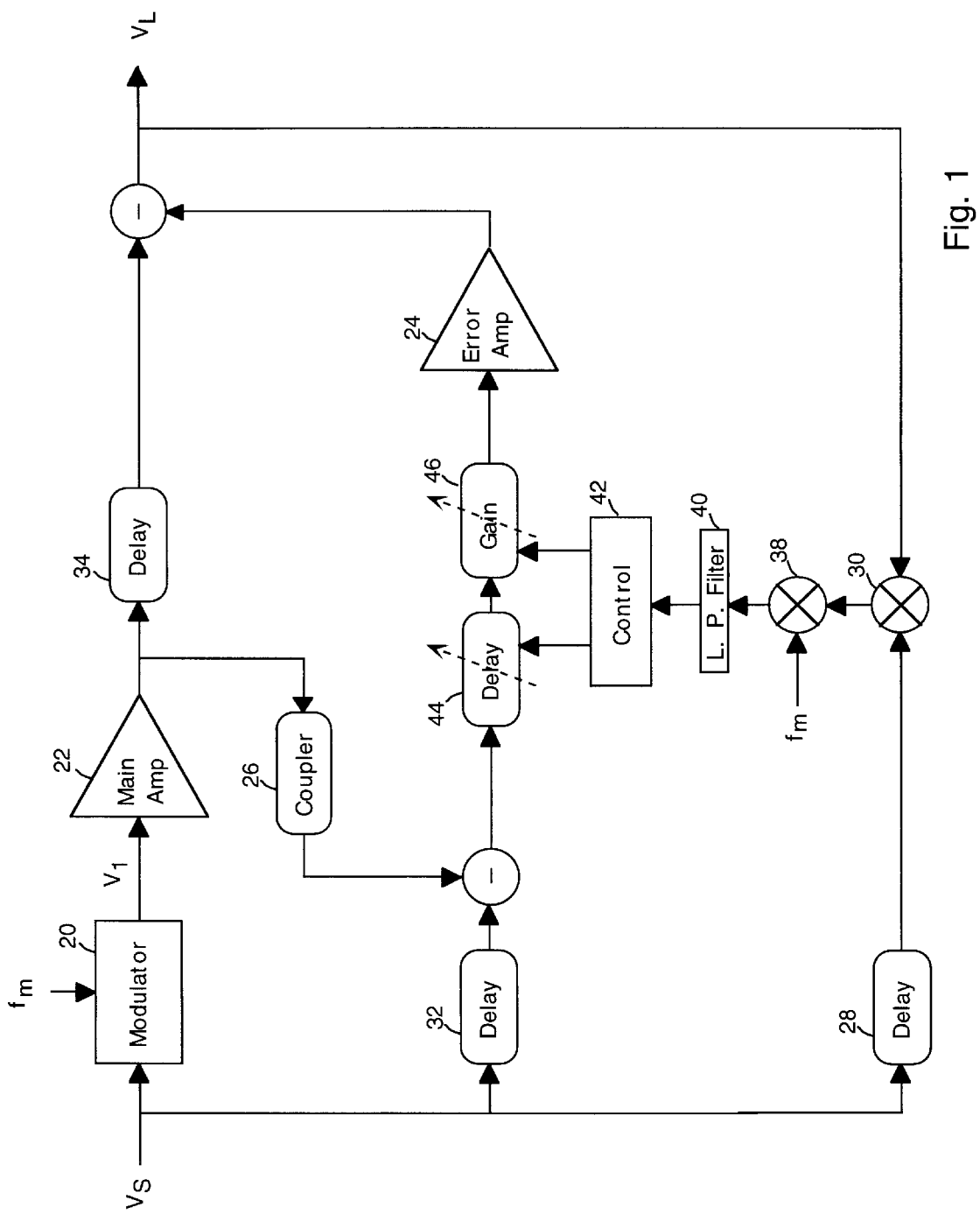
FIG. 1 is a block diagram of a feed forward amplifier in accordance with the present invention.

First referring to FIG. 1, a feed forward amplifier in accordance with the present invention may be seen. The preferred embodiment Feed Forward Amplifier is intended for use as a power multichannel microwave amplifier for cellular phone base stations and the like. As such, it is very important that the nonlinearities of the amplifier not produce intermodulation components at the output of the circuit, which would cause interference and crosstalk between channels.

The typical input signal $V_S$ will be a microwave signal characterized by a plurality of spaced apart carriers, with sidebands at the sides of many of the carriers dependent upon the signal modulated on the respective carrier. The signal $V_S$ is passed through a modulator 20 which provides a small percentage of amplitude modulation by the frequency $f_m$. The frequency $f_m$ is preferably a fairly low frequency, though above the audio range, and may be chosen to be halfway between carriers on the microwave signal, such as approximately 25 KHz. Thus, using 25 KHz, the output of the modulator 20 is the signal $V_1$ having an amplitude which varies in some reasonably small percentage at the frequency of 25 KHz. The output of the modulator 20 may be represented by the equation:

$V_1 = V_S (1 + a \sin 2\pi f_m t)$ where a is<<1 (preferably in the range of 0.01 to 0.1).

Thus $V_1$ will have frequency components of the input signal $V_S$, represented herein by $f_S$ (where $f_S$ is actually a plurality of signal frequencies or bands of signal frequencies), and smaller components representing the sum and difference frequencies $f_S + f_m$ and $f_S - f_m$ from the modulation of $f_S$ by $f_m$.

The output of the modulator 20 is amplified by the main amplifier 22, and after passing through a delay 34, and after the output of the error amplifier 24 is subtracted, provides the output signal $V_L$. At the output of the main amplifier 22, the signal will still have frequency components of $f_S$ of large amplitude, and smaller components of frequencies $f_S + f_m$ and $f_S - f_m$, plus intermodulation components in the required frequency bandwidth of the amplifier, represented by $f_I$ because of nonlinearities in the amplifier.

Also part of the input signal $V_S$ is split off to pass through delay 32, to be subtracted from a component taken from the output of the main amplifier 22 through coupler 26, with the difference being provided as the input to controllable delay 44 and then the controllable gain 46. The amplitude of the $V_S$ signal component in the signal from coupler 26 and the $V_S$ signal from delay 32 are preferably made as equal as reasonably possible, and their phases as close to 180 degrees (subtraction) with respect to each other as possible. Thus the input to the controllable delay element 44 will have components of $f_S + f_m$, $f_S - f_m$ and the intermodulation components $f_I$, plus some residual component of $f_S$. Note that the relationships (relative amplitudes and phases) of the frequencies $f_S + f_m$, $f_S - f_m$ and the intermodulation components $f_I$, in the input to the controllable delay element 44 are identical to the relationships of these frequency components in the output of delay 34.

Also, part of the input voltage $V_S$ will be passed through a delay 28 to a mixer 30, the second input of which is taken from the output $V_L$. Thus the input signal $V_S$ and the output signal $V_L$ are mixed (multiplied) together by the mixer 30. If $V_L$ includes any $f_m$ frequency (25 KHz in the example) modulation of the signal $V_S$ (e.g. $f_S + f_m$ and $f_S - f_m$ components), the output of the mixer (sum and difference frequencies of $f_S$ and $f_S - f_m$, and $f_S$ and $f_S + f_m$) will include $f_m$ frequency components, which when mixed with the frequency $f_m$ again by mixer (multiplier) 38, will give a "DC" and a $2f_m$ signal. The $2f_m$ signal is filtered out by low pass filter 40, and the DC signal is used as an input to a microprocessor based control circuit 42 which provides adaptive gain and delay control for the input to the error amplifier 24 to cause the error amplifier to cancel the $f_S + f_m$ and $f_S - f_m$ frequency components in the output $V_L$. Since the relationships (relative amplitudes and phases) of the frequencies $f_S + f_m$, $f_S - f_m$ and the intermodulation components $f_I$ in the input to, and thus the output from, the error amplifier 24 are identical to the relationships of these frequency components in the output of delay 34, elimination of the frequencies $f_S + f_m$, $f_S - f_m$ from the amplifier output $V_L$ by adding equal and opposite components (subtracting equal components) from the output of error amplifier 24 also eliminates the intermodulation components $f_I$ from the output $V_L$.

Having now described the general detail of the invention, various characteristics and requirements of the components thereof may now be better understood. Delays 34, 28 and 32 are delays in the signal intentionally imposed to compensate for the delays imposed by other circuits operating in parallel therewith. For example, delay 32 is to delay the input signal $V_S$ an amount equal to the delay of the signal $V_S$ through the modulator 20, main amplifier 22 and coupler (and scaler) 26 so that when the two signals are combined 180° out of phase, the input signal $V_S$ from delay 32 will substantially cancel the input signal $V_S$ as amplified by the main amplifier 22 and scaled by coupler 26.

While some residual component of the input signal $V_S$ in the input to the controllable delay and gain adjust 44 and 46 will not affect the operation of the circuit, such residual component should be definitely limited, as otherwise the error amplifier 24 may be saturated by this signal or a larger error amplifier will be needed, and/or the component of the input signal $V_S$ in the error amplifier output 24 will result in an unnecessary, but significant reduction in the circuit output $V_L$. For these reasons, both the phase and the amplitude of the component of the input signal $V_S$ that passes through the delay 32 and the component of the input signal $V_S$ in the output of coupler 26 should be well matched in both phase (timing) and amplitude.

Thus, the delay 32 typically will require at least careful adjustment at the time of manufacture, and more perhaps continuous adjustment during use. If such adjustment is required, the input to the controllable delay 44 may be multiplied by the input signal $V_S$ through an appropriate mixer and the resulting DC output proportional to the component of the input signal $V_S$ in the input to controllable delay 44 used to control the delay 32 so that the amplitude and phase of the component of the input signal $V_S$ to be combined with the coupler output 26 is such as to substantially eliminate any $V_S$ component from the input to the phase adjust 44. Such a control would operate in substantially the same way as the control 42 controlling both the phase and gain for the input of the error amplifier to eliminate the DC output of the low pass filter 40.

With respect to delays 34 and 28, delay 34 is imposed to make up for the delays through the coupler 26, phase and gain adjust elements 44 and 46 and error amplifier 24, while delay 28 is intended to match the delay imposed between the output $V_L$ and the input $V_S$ imposed by the signal path through the main amplifier 22.

In particular, mixer 38, as previously described, is intended to provide a DC output plus an output at a frequency of $2f_m$, which DC component is proportional to the amplitude of the modulation of the input signal $V_S$ by the frequency $f_m$ appearing in the output signal $V_L$. To do this, the $f_m$ frequency component into mixer 38 from mixer 30 must be inphase (as opposed to being in quadrature) with the reference $f_m$ frequency into the mixer 38. Assuming that the $f_m$ frequency into the mixer 38 is inphase with the $f_m$ frequency into the modulator 20, then the $V_S$ signal output by delay 28 into one input of mixer 30 must be substantially in phase with the $V_S$ components in the output signal $V_L$. If, in fact, these components were 90° out of phase with respect to each other, the output of mixer 30 would have a $2f_m$ component but no DC component, regardless of the $f_S - f_m$ and $f_S + f_m$ components in the output $V_L$.

Figure 2:
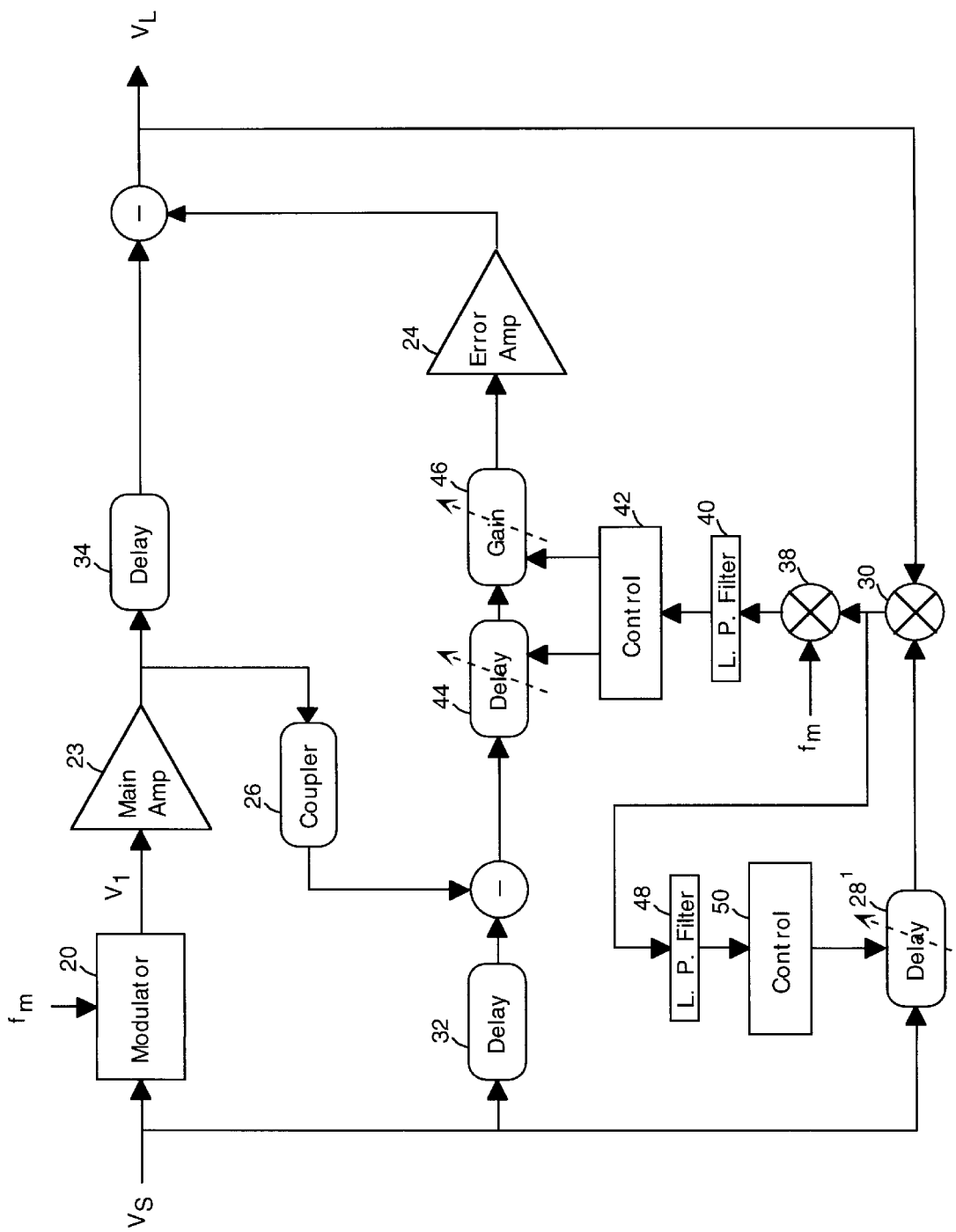
FIG. 2 is a block diagram of a feed forward amplifier like that of FIG. 1, but including a continuously adjustable delay.

Accordingly, delay 28 is most likely to require constant adjustment during use. This may be done by using the output of mixer 30, which is mixing the output of the delay 28 and the output signal $V_L$ (primarily composed of the $V_S$ frequency components anyway) as shown in FIG. 2. The resulting DC component of the output of mixer 30 from low pass filter 48 may be used to control adjustable delay 28' through microprocessor control 50 to bring the $V_S$ components in each of the inputs to mixer 30 in phase, the $V_S$ components being in phase when that DC signal is a maximum.

Referring again to FIG. 1, the control system 42 is preferably a microprocessor controller which responds to the output of the low pass filter to make adjustments in the delay and gain adjust elements and to detect whether each adjustment decreases or increases the $f_S-f_m$ and $f_S+f_m$ components in the output $V_L$. Incremental changes that decrease the $f_S-f_m$ and $f_S+f_m$ components in the output $V_L$ are repeated, and changes that increase the $f_S-f_m$ and $f_S+f_m$ components in the output $V_L$ are reversed, the incremental changes individually being too low to have an audible effect on the microwave amplifier output. Because of the variable delay element 44, the delay 34 in general should not need to be variable.

The net effect of the invention includes the elimination of some of the more complicated and costly components used in the prior art. Also while the present invention has been disclosed and described with respect to certain preferred embodiments thereof, it will be understood by those skilled in the art that the present invention may be varied without departing from the spirit and scope thereof.

What is claimed is:

1. A method of removing intermodulation components from the output of an amplifier in comparison to the input signal to the amplifier comprising the steps of:
   (a) modulating the input signal to the amplifier with a frequency $f_m$ which is substantially lower than the lowest frequency of the pass band of the amplifier;
   (b) amplifying the input signal to the approximate power level of the amplifier output;
   (c) combining the amplified signal obtained in step (b) with the amplifier input signal to provide a signal which includes frequencies of the input signal as modulated by $f_m$ and the intermodulation resulting from the amplification of step (b);
   (d) mixing the amplifier output with the amplifier input signal to provide a signal including a frequency of $f_m$ responsive to the presence, in the amplifier output, of the frequencies of the input signal as modulated by $f_m$;
   (e) mixing the signal provided in step (d) with the frequency $f_m$ to provide a DC signal which is responsive to the presence, in the amplifier output, of frequencies of the input signal as modulated by $f_m$;
   (f) combining with the amplifier output, the signal obtained in step (c) with a gain and phase adjusted to minimize the presence of the intermodulation in the amplifier output.

2. The method of claim 1 wherein in step (f), the presence of the intermodulation in the amplifier output is minimized by minimizing the DC signal obtained in step (e).

3. The method of claim 1 wherein the frequency $f_m$ is chosen to be sufficiently low so that the frequencies representing the modulation of the input signal by $f_m$ are within the pass band of the amplifier.

4. The method of claim 1 wherein the input signal is a microwave signal.

5. The method of claim 4 wherein the input signal is a signal having a plurality of carriers spaced from each other by equal frequency increments, and wherein $f_m$ is equal to one half the frequency increment between adjacent carriers in the input signal.

6. The method of claim 1 wherein the input signal is a signal having a plurality of carriers spaced from each other by equal frequency increments, and wherein $f_m$ is equal to one half the frequency increment between adjacent carriers in the input signal.

7. The method of claim 1 wherein in step (a), the modulation index is approximately in the range of 0.01 to 0.1.

8. A method of removing intermodulation components from the output of a microwave amplifier in comparison to the input signal to the microwave amplifier comprising the steps of:
   (a) modulating the input signal to the microwave amplifier with a frequency $f_m$ so that the frequencies representing the modulation of the input signal by $f_m$ are within the pass band of the amplifier, the modulation having a modulation index of less than 1;
   (b) amplifying the input signal to the approximate power level of the microwave amplifier output;
   (c) combining the amplified signal obtained in step (b) with the microwave amplifier input signal to provide a signal which includes frequencies of the input signal as modulated by $f_m$ and the intermodulation resulting from the amplification of step (b);
   (d) mixing the microwave amplifier output with the microwave amplifier input signal to provide a signal including a frequency of $f_m$ responsive to the presence, in the microwave amplifier output, of the frequencies of the input signal as modulated by $f_m$;
   (e) mixing the signal provided in step (d) with the frequency $f_m$ to provide a DC signal which is responsive to the presence, in the microwave amplifier output, of frequencies of the input signal as modulated by $f_m$;
   (f) combining with the microwave amplifier output, the signal obtained in step (c) with a gain and phase adjusted to minimize the presence of the intermodulation in the microwave amplifier output by minimizing the DC signal obtained in step (e).

9. The method of claim 8 wherein the input signal is a signal having a plurality of carriers spaced from each other by equal frequency increments, and wherein $f_m$ is equal to one half the frequency increment between adjacent carriers in the input signal.

10. The method of claim 8 wherein in step (a), the modulation index is approximately in the range of 0.01 to 0.1.

11. An amplifier comprising:
   a modulator coupled to an input signal and modulating the input signal with a frequency $f_m$ which is substantially lower than the lowest frequency of the pass band of the amplifier;
   a power amplifier coupled to the input signal and amplifying the input signal to the approximate power level of the amplifier output;
   a combining circuit coupled to the input signal and the output of the power amplifier and combining the amplified signal from the power amplifier with the input signal with a relative phase and amplitude to provide a signal which includes frequencies of the input signal as modulated by $f_m$ and which includes the intermodulation resulting from the power amplifier;
   a first mixer coupled to the input signal and the amplifier output and mixing the amplifier output with the amplifier input signal to provide a signal including a frequency of $f_m$ responsive to the presence, in the amplifier output, of the frequencies of the input signal as modulated by $f_m$;
   a second mixer coupled to the first mixer and mixing the signal provided by the first mixer with the frequency $f_m$ to provide a DC signal which is responsive to the presence, in the amplifier output, of frequencies of the input signal as modulated by $f_m$;
   a feedback control circuit coupled to the second mixer, the combining circuit and the amplifier output and combining with the amplifier output, the signal obtained from the combining circuit with a gain and phase adjusted to minimize the presence of the intermodulation in the amplifier output.

12. The amplifier of claim 11 wherein the feedback control circuit is a circuit to minimize the DC signal obtained from the second mixer.

13. The amplifier of claim 11 wherein the modulator provides the frequencies representing the modulation of the input signal by $f_m$ which are within the pass band of the amplifier.

14. The amplifier of claim 11 wherein the amplifier is a microwave amplifier.

15. The microwave amplifier of claim 14 wherein the input signal is a signal having a plurality of carriers spaced from each other by equal frequency increments, and wherein $f_m$ is equal to one half the frequency increment between adjacent carriers in the input signal.

16. The amplifier of claim 11 wherein the input signal is a signal having a plurality of carriers spaced from each other by equal frequency increments, and wherein $f_m$ is equal to one half the frequency increment between adjacent carriers in the input signal.

17. The amplifier of claim 11 wherein the modulator has a modulation index of approximately 0.01 to 0.1.

18. A microwave amplifier comprising:

a modulator coupled to a microwave amplifier input signal and modulating the input signal with a frequency $f_m$ so that the frequencies representing the modulation of the input signal by $f_m$ are within the pass band of the microwave amplifier, the modulation having a modulation index of less than 1;

a power amplifier amplifying the input signal to the approximate power level of the microwave amplifier output;

a combining circuit combining the output of the power amplifier with the microwave amplifier input signal to provide a signal which includes frequencies of the input signal as modulated by $f_m$ and the intermodulation resulting from the power amplifier;

a first mixer mixing the microwave amplifier output with the microwave amplifier input signal to provide a signal including a frequency of $f_m$ responsive to the presence, in the microwave amplifier output, of the frequencies of the input signal as modulated by $f_m$;

a second mixer mixing the signal provided by the first mixer with the frequency $f_m$ to provide a DC signal which is responsive to the presence, in the microwave amplifier output, of frequencies of the input signal as modulated by $f_m$;

a feedback control circuit combining with the microwave amplifier output, the signal obtained from the combining circuit with a gain and phase adjusted to minimize the presence of the intermodulation in the microwave amplifier output by minimizing the DC signal from the second mixer.

19. The microwave amplifier of claim 18 wherein the input signal is a signal having a plurality of carriers spaced from each other by equal frequency increments, and wherein $f_m$ is equal to one half the frequency increment between adjacent carriers in the input signal.

20. The microwave amplifier of claim 18 wherein the modulator has a modulation index approximately in the range of 0.01 to 0.1.

* * * * *